(12) United States Patent
Heiser

(10) Patent No.: US 6,504,377 B1
(45) Date of Patent: Jan. 7, 2003

(54) DEVICE FOR QUANTITATIVE DETECTION OF COPPER IN SILICON BY TRANSIENT IONIC DRIFT AND METHOD USING SAME

(75) Inventor: Thomas Heiser, Strasbourg (FR)

(73) Assignee: Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 09/763,792

(22) PCT Filed: Jun. 29, 2000

(86) PCT No.: PCT/FR00/01837

§ 371 (c)(1),
(2), (4) Date: Feb. 27, 2001

(87) PCT Pub. No.: WO01/03177

PCT Pub. Date: Jan. 11, 2001

(30) Foreign Application Priority Data

Jun. 30, 1999 (FR) .......................................... 99 08522

(51) Int. Cl.[7] .............................................. G01N 27/62
(52) U.S. Cl. ...................................................... 324/468
(58) Field of Search ................................ 324/468, 719, 324/760, 765, 514, 71.4, 71.5; 438/710, 712

(56) References Cited

U.S. PATENT DOCUMENTS 4,371,587 A * 2/1983 Peters .................... 204/157.45
4,474,829 A * 10/1984 Peters ......................... 148/241
6,095,084 A * 8/2000 Shamouilian et al. .... 118/723 E

FOREIGN PATENT DOCUMENTS

| JP | 07 297246 | 3/1996 |
| WO | WO 98/35383 | 8/1998 |

OTHER PUBLICATIONS

T Heiser et al., "Transient Ion Drift Detection of Low Level Copper Contamination in Silicon" *Applied Physics Letters*, US, American Institute of Physics, New York, vol. 70, No. 26, Jun. 30, 1997, pp 3576–3578.

T. Heiser et al., "Determination of the Copper Diffusion Coefficient in Silicon from Transient Ion–Drift", *Applied Physics A. Solids and Surfaces*, DE, Springer Verlag. Heidelberg, vol. A57, No. 4, Jan. 1, 1993, pp 325–328.

* cited by examiner

Primary Examiner—N. Le
Assistant Examiner—J Kerveros
(74) Attorney, Agent, or Firm—Young & Thompson

(57) ABSTRACT

An analyzing device for producing measurements using transient ionic drift technique and an analysis method using same. The device for the quantitative detection of copper in silicon by transient ionic drift essentially comprises a heater and a rapid cooler for the sample to be analyzed, an electrode for measuring the electrical capacity of the sample and a unit generating an energizing signal and processing the measuring electric signal. The heater (2) for the sample (4) to be analyzed consists in at least a halogen lamp, the rapid cooler (3) for the sample (4) to be analyzed is a water cooler, and the electrode for measuring the sample (4) to be analyzed is a mercury electrode.

12 Claims, 3 Drawing Sheets

DEVICE FOR QUANTITATIVE DETECTION OF COPPER IN SILICON BY TRANSIENT IONIC DRIFT AND METHOD USING SAME

FIELD OF THE INVENTION

The present invention concerns analysis by TID (Transient Ion Drift) and has for its object an analysis device permitting carrying out measurements using this technique as well as the analysis process embodying it.

BACKGROUND OF THE INVENTION

In the physicochemical industry, in particular in the field of semiconductors, it is essential to be able to detect elements or chemical compounds present in trace amounts, for example impurities present in quantities of the order of ppm (parts per million), ppb (parts per billion) . . .

Thus, for example, it is very important for the quality of produced semiconductors, to be able to detect certain impurities with a very high detection limit, particularly less than $10^{12}$ atoms/cm$^3$.

Moreover, the importance enjoyed at present by the technology of copper interconnections in the microelectronic industry is likely to open a considerable field of application for the TID technique.

Thus, in research and development activities in microelectronics, this technique could be particularly used to evaluate the permeability of diffusion barriers. In the microelectronic industry it can serve for system controls of metallic contamination.

The TID technique used by the applicant C.N.R.S. permits detecting the element copper in trace amounts in silicon crystals with a detection limit of the order of that mentioned above. The basic principle, the theoretical modeling and experiments showing the feasibility of the use of this technique have been the object of different publications in international scientific reviews and particularly in the one entitled "Transient Ion Drift Induced Capacitance Signals in Semiconductors" which appeared in PHYSICAL REVIEW B Volume 58, No. 7 of Aug. 15, 1998 and in which was cited a publication which envisages, for the first time, the use of this method for the quantitative determination of copper in silicon (Appl. Phys. Lett. 70, 3576 (1997)).

However, the TID technique as described in these different publications is not industrially usable to the extent to which the procedure for preparation of specimens, the carrying out of the test structure and the test of the physical origin of the signal are difficult or even not at all achievable on an industrial scale.

Thus, for example, the experimental techniques described in the above publications require a rapid cooling obtained by vertical drop, under the influence of gravity of the specimen into a vat containing ethylene glycol, a substance known for its high thermal conductivity.

This manner of proceeding, which can be satisfactory in the framework of an isolated measurement in a research laboratory, has many more drawbacks when transposed into the industrial field.

Thus, the high thermal stresses frequently give rise to the shattering of the analyzed specimens, the delicate handling necessary and the size limit to small specimens (less than about 1 cm), as well as the use of a specific chemical cooling liquid such as ethylene glycol, are conditions which are not adapted to systematic or automated use of this technique in industry, for example, in an environment with a controlled atmosphere (clean room) and can have risks for the workers and/or the environment.

A second source of difficulties which renders the TID technique unusable in the industrial field, arises from the production of the test structure itself. Thus, the TID analysis requires a metal/semiconductor rectifier interface to carry out capacitative measurement. In research laboratories, this structure can be obtained by vacuum evaporation of a metallic layer of aluminum on silicon.

Here again, the disadvantages which result are not tolerable in an industrial context.

Thus, the excessive duration necessary for the preparation of the specimen (about two hours for an aluminum deposit of 100 $\mu$m by chemical deposition in vapor phase) decreases productivity and, more seriously, has the result of a loss of sensitivity of the technique. The TID signal decreases after thermal quenching with a time constant of several hours by virtue of the precipitation of interstitial copper which is thus not available or sufficiently mobile to contribute to the measurement signal.

Similarly, the alteration of the specimen by deposition of a metallic layer which cannot, in the best cases, be ultimately removed other than by chemical attack, requires a supplemental treatment that is costly in time and money and which is damaging to the specimen itself, which influences negatively the quality of the surface of the tested specimen (destructive or semi-destructive method).

Finally, the exploitation, which is to say the interpretation properly so-called of the analysis signal obtained in the laboratory by the use of known devices, is no longer satisfactory for industrial application.

Thus, the signals obtained by the TID technique are electrical signals which are differentiated from the signals due to other phenomena (emission of free charge carriers) only by the temporal shape of the electrical excitation which gave rise to the signal.

In studies carried out in the laboratory, previously published and described in the mentioned document, it has been suggested to measure the amplitude of the signal as a function of the duration and the height of the electrical impulse. The corresponding evolution is thus characteristic of the physical process (ionic drift or emission of electrical carriers) which is at the origin of the signal.

This procedure is however too long to be of practical use in industry and is not susceptible to being automated.

OBJECT OF THE INVENTION

The present invention has particularly for its object to overcome these drawbacks.

SUMMARY OF THE INVENTION

To this end, it has for its object a device for the quantitative determination of copper in silicon by transitory ion drift (TID) comprising essentially a heating means and a rapid cooling means for the specimen to be analyzed, an electrode for measuring the electrical capacity of the specimen as well as a unit for generating an excitation signal and for processing the electrical measuring signal, characterized in that:

the heating means for the specimen to be analyzed consists in at least one halogen lamp, the rapid cooling means for the specimen to be analyzed is a water cooler, and the electrode for measuring the specimen to be analyzed is a mercury electrode.

The invention also has for its object a process for the quantitative determination of copper in silicon by transient ion drift (TID) using a device according to the invention and characterized in that it comprises the steps consisting in:

introducing the specimen into the thermal measuring chamber, reheating the specimen to a temperature comprised between about 900 and 1000° C., for a time comprised between about 30 second and 3 minutes, preferably at 950° C. for 2 minutes thanks to the halogen lamp heating means, abruptly cooling the specimen by the rapid water cooling means, carrying out the measurement by means of the mercury electrode and by a specific electrical signal generated by the unit for generation and treatment of electrical signals, and using the obtained result in the form of a curve or a table of data.

BRIEF DESCRIPTION OF THE DRAWINGS

The invention will be better understood from the following description, which relates to preferred embodiments, given by way of non-limiting examples, and explained with reference to the accompanying schematic drawings, in which:

"FIG. 3 shows a shape of an electrical excitation signal applied to the measuring device according to the present invention.

DETAILED DESCRIPTION OF THE INVENTION

Figure 1:
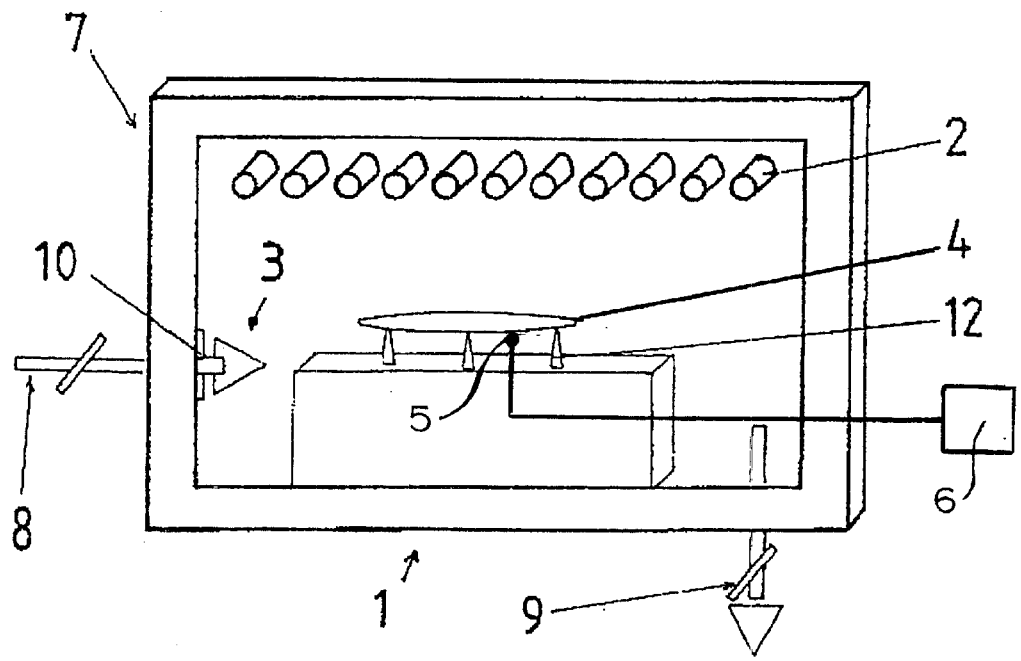
FIG. 1 shows schematically an example of embodiment of an analysis device for a specimen by TID.

According to the invention, and as shown in FIG. 1, the device 1 for quantitative determination of copper in silicon by transient ion drift (TID) comprises essentially a heating means 2, a rapid cooling means 3 of the specimen 4 to be analyzed, a measuring electrode 5 (not shown) of the electrical capacity of the specimen 4 as well as a unit 6 (not shown) for generating an excitation signal S and for processing the electrical measuring signal, characterized in that:

the heating means 2 for the specimen 4 being analyzed consists in at least one halogen lamp, the rapid cooling means 3 for the specimen 4 to be analyzed is a water cooler, and electrode 5 for measuring the specimen 4 to be analyzed is a mercury electrode.

It has been found in a surprising and unexpected manner, that such a device 1 would permit carrying out in an economical manner and with complete safety a large series of rapid, precise and significant measurements, which was not the case with the known devices solely suitable for laboratory and research use and requiring the intervention of highly qualified specialists.

Moreover, the measurement carried out by the present device 1 can be very well carried out within the framework of an automated procedure, which was not the case with the laboratory devices.

Figure 2:
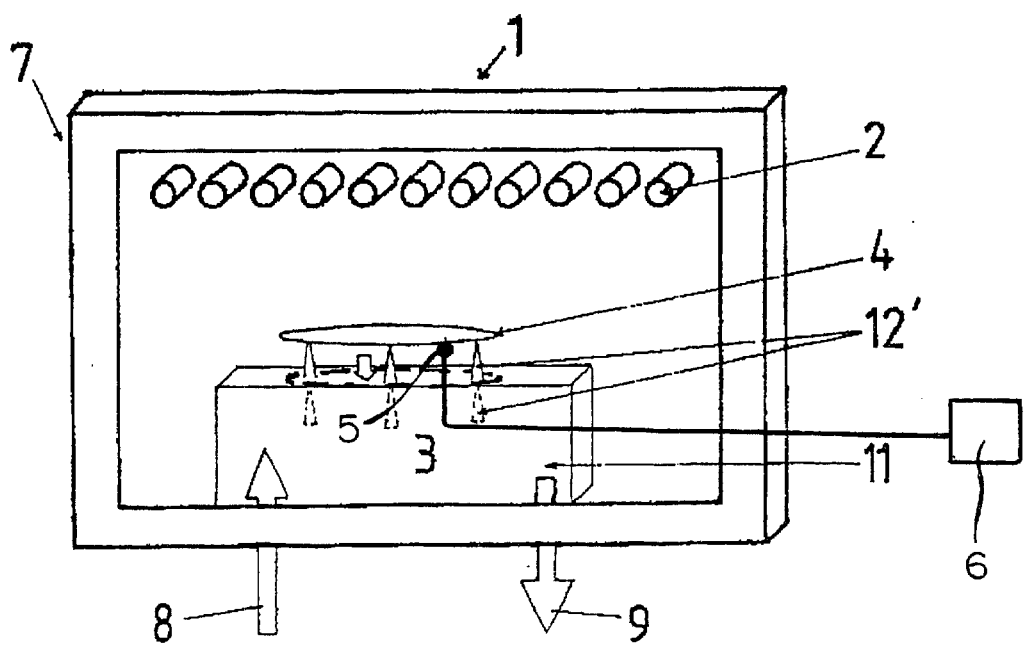
FIG. 2 shows schematically another embodiment of a device for analysis of a specimen by TID.

As is seen in FIGS. 1 and 2, which show, in a non-limiting way, two modified embodiments of the device of the present invention, the specimen 4 to be analyzed, the heating means 2 and the rapid water cooling means 3, are disposed in a thermal chamber 7 of the oven type having an inlet 8 and an outlet 9 for cooling water. The heating means 2 which is illustrated there represents a series of halogen lamps which permit very rapidly reaching the high temperatures necessary for the heating of the specimen 4 to be analyzed.

In the first embodiment shown in FIG. 1, the device 1 according to the present invention is characterized in that the water cooling is carried out in the form of an injection of cooling water under pressure against the specimen 4 by means of a nozzle 10 so as to quench the specimen 4.

To do this, the specimen 4 is fixed on fixed supports 12, present preferably in the number of 3 and preferably in the form of points disposed at summits of an equilateral triangle. The specimen 4 is fixed there by techniques known per se such as cementing, screwing, clipping, etc.

The nozzle 10 sends cooling water, which enters at ambient temperature the thermal chamber 7 through the inlet 8, against the specimen 4 at a pressure of the order of several bars, which corresponds to a flow rate of several liters per minute.

In this way, the specimen 4 is abruptly cooled, which is essential to obtain a significant measurement.

In a second preferred embodiment shown in FIG. 2, the device 1 according to the present invention is characterized in that the rapid cooling means 3 consists of a block 11 for cooling, made of a highly heat-conductive material traversed by cooling water and with which one of the flat surfaces comes into contact with the specimen 4 to be cooled.

The use of water as cooling liquid in the place of ethylene glycol has numerous advantages, both from an economical standpoint and from a standpoint of facility and safety of use (no risk of explosion, no toxic vapors, no risk for the environment . . . ).

The use of water as the cooling liquid also permits omitting the step of cleaning and rinsing the specimen 4 necessary after a thermal quenching carried out with another liquid such as ethylene glycol.

As can be seen in FIG. 2, the specimen 4 to be analyzed is placed in this modification on one or several movable support elements 12' maintaining said specimen 4 at a certain distance from the cooling block 11. These movable supports 12' permit, by retraction into the cooling block 11, placing a surface of the specimen 4 in intimate thermal contact with a surface of said cooling block 11, which permits obtaining the rapid cooling necessary to be able to make a correct quantitative measurement of the concentration of impurities present in the specimen 4 to be analyzed.

In a particularly advantageous manner, the movable support element or elements 12' are in the form of a plurality of points, preferably 3 in number and disposed at the summits of a triangle, on the ends of which rest the specimen 4 to be analyzed.

As to the constituent material of said fixed or movable supports 12 or 12', there will preferably be selected a material of low thermal conductivity, resistant to the high temperatures reached during reheating of the specimen 4 and to the abrupt variations of temperature during quenching of said specimen 4 to be analyzed.

The fixed or movable supports 12 or 12' also guarantee a stable position of the specimen 4 adjacent the heating means 2 whilst avoiding too great a premature reheating of the cooling block 11 whose temperature is typically of the order of that of the ambient temperature before starting the heating means 2 and of the order of 300° C. when the specimen 4 has reached its reheated temperature.

By way of preferred example, the fixed or movable support element or elements 12 or 12' are made of a material of low thermal conductivity such as quartz.

For the analysis properly so called of the specimen 4, the TID technique requires a metal/semiconductor rectifier interface to permit carrying out capacitative measurement.

However, it has been determined in an unexpected and surprising manner that the use of a mercury measuring electrode 5 was perfectly adapted to provide such an interface, which eliminates the known drawbacks of the aluminum interfaces of the prior art.

Thus, the mercury measurement electrode 5 permits providing a temporary electrical contact which does not alter the specimen 4 to be analyzed.

As mercury measurement electrode 5 could be used, by way of non-limiting example, an electrode of the type of that known by the reference MDC Hg-412-4RL sold by the company MSI Electronics Inc.

In this type of electrode, the rectifier structure Hg/Si of the mercury measurement electrode 5 is made such that the contact of the liquid mercury with the specimen 4 to be analyzed takes place through a mica mask. The specimen 4 is thus maintained by suction on the mica mask with the help of a series of concentric openings. Another central opening in the mask ensures placing the mercury in contact with the specimen 4 to be analyzed. During measurement, the mercury is sucked by an air vacuum from a lower reservoir through the mask to come into contact with the specimen 4 to be analyzed. Once the measurement is achieved, said vacuum is released such that the mercury falls again into its reservoir while interrupting the electrical contact with the specimen 4, leaving no trace on this latter.

Figure 4:
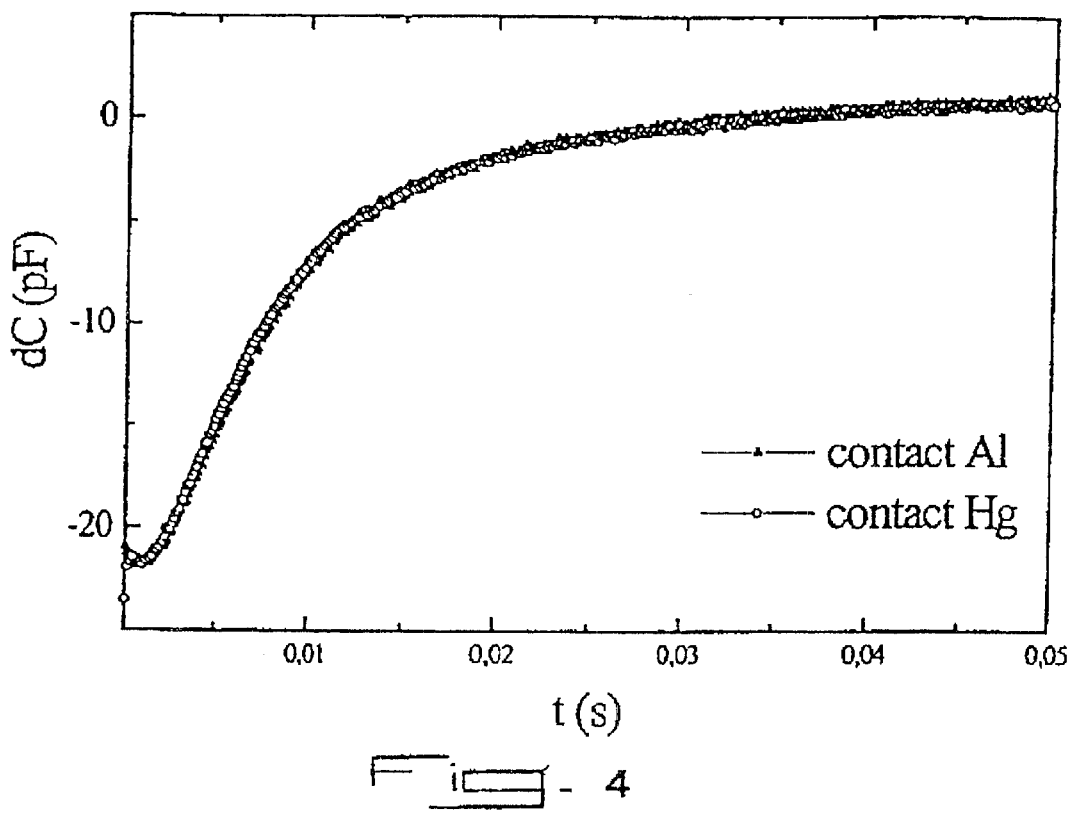
FIG. 4 shows a comparative diagram of two normalized TID measurements, one carried out with a device according to the prior art, and the other with a device according to the present invention.

As can be seen in FIG. 4, the measurements of capacity of the two TID signals, one obtained with an aluminum contact (prior art) and the other with a contact according to the present invention (Hg), all the other parameters being unchanged, match perfectly.

The mercury electrode 5 thus permits obtaining measurements as precise as those obtained by the known devices without destroying or altering the specimen 4 to be analyzed. The sensitivity of the technique is also greatly improved, the measurement with the mercury electrode 5 being adapted to be immediately carried out, without careful preparation, after the thermal treatment.

In a particularly advantageous manner, the TID analysis can take place in situ, which is to say in the heating oven, by means of the mentioned mercury electrode 5.

Finally, the technique according to the present invention also permits a greater flexibility in measurement in which the analysis can be very well carried out on specimens 4 of larger sizes (>1 cm, up to for example 10 cm).

A unit 6 for generation and processing of the electrical measuring signal, generates an electrical signal S for excitation of the specimen 4 in the form of a first negative level E in the constant portion of which will be added a second positive level e' or negative level e, this signal S being easily integrable into an automated procedure for processing the TID signal.

Figure 3A:
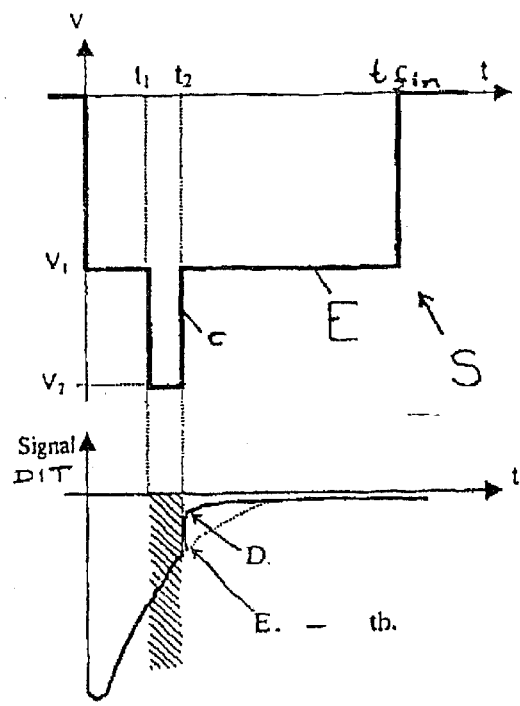
"FIG. 3a shows a first shape of an electrical excitation signal applied to the measuring device according to the present invention.
Figure 3B:
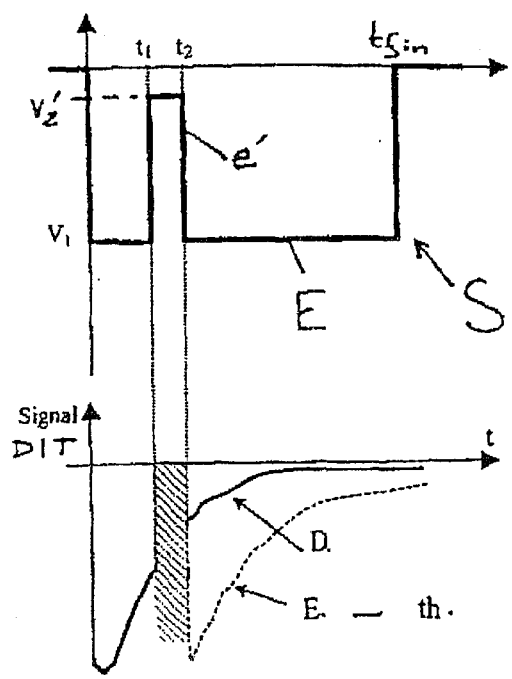
FIG. 3b represents a second shape of an electrical excitation signal applied to the measuring device according to the present invention.

There is used for this purpose a pulse of particular shape such as shown in FIGS. 3a or 3b.

As already mentioned, the TID signals are of an electrical nature and are differentiated from signals from other mechanisms, such as the emission of carriers of free charges, only by the time shape of the electrical excitation which has given rise to the signal. The evolution of the signal as a function of the duration and amplitude of the electrical pulse is characteristic of the physical process (ion drift D, or thermal emission of electrical carriers E-th.) at the origin of the signal. This procedure is however too long and can be used for each analysis only with difficulty.

To avoid the mentioned drawbacks, it has been determined that the use of a pulse of particular shape such as shown in FIG. 3a was particularly advantageous.

FIGS. 3a and 3b show that the excitation signal S is comprised of two signals of a shape having superposed levels respectively (E,e) and (E,e'). The base signal E is constituted by a first "negative" level, which is to say a constant negative value $V_1$ of several volts, between the instant 0 and $t_{end}$ of the effect of the signal.

In the case shown in FIG. 3a, the base signal E is surmounted by a second signal in the shape of a level e which is also negative, of a constant value $V_2$ of several volts, between the instants of application $t_1$ and $t_2$.

In the case shown in FIG. 3b, the base signal E is this time surmounted by a second signal in the form of a positive level e' of a constant value $V_2$, between the instants of application $t_1$ and $t_2$. The evolution of the signal after a time $t_2$ depends directly on the physical process in question.

In case of ion drift (D), the increase of the voltage in the time interval $[t_1; t_2]$ of the order of a millisecond accelerates the evacuation of the atoms toward the quasi-neutral region of the semiconductor and induces a considerable decrease of the transitory signal after $t_2$, whilst the emission of the free carriers (thermal emission E-th) is only very slightly affected by the momentary increase of the voltage (FIG. 3a).

Similarly, when the pulse of FIG. 3d is applied, the behavior of the signal depends on the subjacent physical mechanism: the reduction of the polarization during a brief interval $[t_1; t_2]$ only slightly influences the evolution of the signal induced by the ion drift (D), whilst in the case of free carrier emission (E-th) the signal returns, at time $t_2$, to its value at the instant $t_0$.

The use of these two "test" procedures therefore implies only the generation of an electrical pulse of a particular shape. It can be easily integrated into an automated procedure for processing the TID signal.

The procedure for quantitative determination of copper in silicon by transient ion drift (TID) using the device according to the present invention is characterized in that it comprises the steps consisting in:

introducing the specimen 4 into the thermal measuring chamber 7, reheating the specimen 4 to a temperature comprised between about 900 and 1000° C., for a time comprised between about 30 seconds and 3 minutes, preferably to 950° C. for 2 minutes by the halogen lamp heating means 2, abruptly cooling the specimen 4 by the rapid water cooling means 3, carrying out the measurement by means of the mercury electrode 5 and of a specific electrical signal S generated by the unit 6 for generating and processing of electrical signals, and using the results obtained in the form of a curve or a table of data.

In a particularly advantageous manner, the step of abruptly cooling the specimen 4 consists in lowering the temperature of the specimen 4 by about 900° C. in less than 10 seconds.

The device 1 of the present invention thus provides a technique for quantitative determination of copper in silicon which is easy and rapid to use, non-destructive, perfectly reproducible and which supplies precise results with a very high limit of detection.

This determination technique can easily be automated and permits supplying, particularly to industry, a high performance tool for routine characterization of the contamination of silicone with copper.

Of course, the invention is not limited to the embodiments described and shown in the accompanying drawings. Modifications remain possible, particularly as to the construction of the various elements or by substitution of technical equivalents, without thereby departing from the scope of protection of the invention.

What is claimed is:

1. Device for the quantitative determination of copper in silicon by transient ionic drift (TID) comprising essentially a heating means and a rapid cooling means for the specimen to be analyzed, an electrode for measuring the electrical capacitance of the specimen as well as a unit for generation of an excitation signal and for processing the electrical measurement signal, characterized in that:

the heating means (2) for the specimen (4) to be analyzed consists in at least one halogen lamp, the rapid cooling means (3) for the specimen (4) to be analyzed is a water cooler, and the electrode (5) for measuring the specimen (4) to be analyzed is a mercury electrode.

2. Device according to claim 1, characterized in that the specimen (4) to be analyzed, the heating means (2) and the rapid water cooling means (3) are disposed in a thermal chamber (7) of the oven type having an inlet (8) and an outlet (9) for cooling water.

3. Device according to claim 1, characterized in that the water cooling is carried out in the form of an injection of cooling water under pressure against the specimen (4) by means of a nozzle (10) so as to carry out quenching of the specimen (4).

4. Device according to claim 1, characterized in that the rapid cooling means (3) consists in a cooling block (11) made of a highly heat-conductive material traversed by cooling water and of which one of the flat surfaces comes into contact with the specimen (4) to be cooled.

5. Device according to claim 4, characterized in that the specimen (4) to be analyzed in placed one or several movable support elements (12') holding said specimen (4) at a certain distance from the cooling block (11) and which permit, by retraction into the cooling block (11), placing a surface of the specimen (4) in intimate thermal contact with a surface of said cooling block (11).

6. Device according to claim 5, characterized in that the movable support element or elements (12') are in the form of a plurality of points, preferably three in number and disposed at the summits of a triangle, on the end of which rests the specimen (4) to be analyzed.

7. Device according to claim 5, characterized in that the movable support element or elements (12') are made of a material of low thermal conductivity such as quartz.

8. Device according to claim 1, characterized in that the unit (6) for generation and processing of the electrical measuring signal generates an electrical signal (S) for excitation of the specimen (4) in the form of a first negative level (E) in the constant portion of which will be added a second positive level (e') or negative level (e), this signal (S) being easily integrable into an automated procedure for processing of the TID signal.

9. Process for the quantitative determination of copper in silicon by transient ion drift (TID) using a device according to claim 1, characterized in that it comprises the steps consisting in:

introducing the specimen (4) into the thermal measuring chamber (7), heating the specimen (4) to a temperature comprised between about 900 and 1000° C., for a time comprised between about 30 seconds and 3 minutes, preferably to 950° C. for 2 minutes by halogen lamp heating means (2), abruptly cooling the specimen (4) by rapid water cooling means (3), carrying out the measurement by means of the mercury electrode (5) and of a specific electrical signal (S) generated by the unit (6) for generation and processing of electrical signals, and using the result obtained in the form of a curve or a table of data.

10. Process according to claim 9, characterized in that the step of abrupt cooling of the specimen (4) consists in lowering the temperature of the specimen (4) by about 900° C. in less than 10 seconds.

11. Process according to claim 9, wherein said rapid water cooling means (3) cools the specimen (4) by injecting cooling water under pressure against the specimen (4) by means of a nozzle (10).

12. Device according to claim 1, wherein said rapid cooling means (3) cools the specimen (4) to be analyzed at a cooling rate of about 900° C. in less than 10 seconds.

* * * * *